United States Patent
Adachi et al.

(10) Patent No.: US 8,755,423 B2
(45) Date of Patent: Jun. 17, 2014

(54) SURFACE EMITTING LASER MODULE AND VERTICAL ILLUMINATED PHOTODIODE MODULE

(75) Inventors: Koichiro Adachi, Musashino (JP); Yasunobu Matsuoka, Hachiojo (JP); Toshiki Sugawara, Kokbunji (JP); Masahiro Aoki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 100 days.

(21) Appl. No.: 12/759,024

(22) Filed: Apr. 13, 2010

(65) Prior Publication Data

US 2010/0265983 A1  Oct. 21, 2010

(30) Foreign Application Priority Data

Apr. 20, 2009 (JP) .................. 2009-101963

(51) Int. Cl.
  *H01S 5/00* (2006.01)
(52) U.S. Cl.
  USPC ...................................... 372/50.23
(58) Field of Classification Search
  CPC ............. H01S 5/026; H01S 5/20; H01S 5/18
  USPC ........... 257/E31.127; 372/50.1, 50.23
  See application file for complete search history.

(56) References Cited

U.S. PATENT DOCUMENTS

| 5,195,150 | A | 3/1993 | Stegmueller et al. |
| 7,298,941 | B2 * | 11/2007 | Palen et al. ............ 385/33 |
| 7,502,403 | B2 * | 3/2009 | Shinoda et al. ........ 372/50.23 |
| 7,636,378 | B2 * | 12/2009 | Kitatani et al. ........ 372/50.1 |
| 7,760,782 | B2 * | 7/2010 | Aoki .................... 372/44.01 |
| 2005/0084218 | A1 | 4/2005 | Ide et al. |
| 2008/0266638 | A1 | 10/2008 | Shinoda et al. |

FOREIGN PATENT DOCUMENTS

| JP | 63-287084 A | 11/1988 |
| JP | 5-88029 A | 4/1993 |
| JP | 5-129638 A | 5/1993 |
| JP | 10-39162 A | 2/1998 |
| JP | 10-290050 A | 10/1998 |
| JP | 2005-85942 A | 3/2005 |
| JP | 2008-277445 A | 11/2008 |
| WO | 2008/035466 A1 | 3/2008 |

* cited by examiner

*Primary Examiner* — Tod T Van Roy
*Assistant Examiner* — Tuan Nguyen
(74) *Attorney, Agent, or Firm* — Mattingly & Malur, PC

(57) ABSTRACT

In order to provide a compact optical module permitting highly efficient optical coupling and having components thereof highly densely packaged, a light emitting diode that is included in the optical module and emits light in a vertical direction with respect to a principal surface of a semiconductor substrate is provided with a lens integrated into a light emitting region, and a retaining section integrated to surround the light emitting region. Accordingly, readiness in alignment of the light emitting diode and an optical fiber, which guides light emitted from the light emitting diode, with each other is upgraded. Eventually, the compact optical module permitting highly efficient optical coupling and having components thereof highly densely packaged can be provided.

6 Claims, 10 Drawing Sheets

SURFACE EMITTING LASER MODULE AND VERTICAL ILLUMINATED PHOTODIODE MODULE

CLAIM OF PRIORITY

The present application claims priority from Japanese patent application JP 2009-101963 filed on Apr. 20, 2009, the content of which is hereby incorporated by reference into this application.

BACKGROUND OF THE INVENTION

1. Field of the Invention

The present invention relates to an optical module, or more particularly, to an optical module having a surface emitting laser diode or a vertically illuminated photodiode packaged, such as an optical transmission module or a CAN module.

2. Description of the Related Art

In recent years, in the field of information and telecommunications, data communication networks over which a large amount of data is transferred at a high speed using light have been rapidly brought into service, and optical fiber networks such as a backbone network, access networks, and metropolitan area networks have been deployed over the relatively long distances of several kilometers or more. In the future, it will prove effective to utilize optical data transmission over such a very short distance as a distance between pieces of transmission equipment (from several meters to several hundreds of meters) or an intra-equipment distance (several centimeters to several tens of centimeters) for processing the large amount of data without delay. Along with prevalence of high-definition images, even pieces of commercial off-the-shelf equipment including video equipment such as a video camera, a personal computer, and a portable cellular phone will be requested to transmit a video signal between a monitor and a terminal at a high speed over a large-capacity cable. Adopting optical data transmission lines will be found effective. Existing optical modules are disclosed in, for example, Japanese Patent Application Laid-Open Publication Nos. 2005-85942, Hei 10-039162 and 2008-277445.

SUMMARY OF THE INVENTION

A semiconductor laser diode that is a key device of an optical module falls into three types according to a combination of the direction of a cavity (vertical cavity or horizontal cavity) and a surface through which a laser beam is emitted (edge emitting type or surface emitter type). The first type refers to a horizontal cavity edge emitting laser diode, the second type refers to a vertical cavity surface emitting laser diode, and the third type refers to a horizontal cavity surface emitting laser diode. For realizing a more compact and lower-cost optical module, it is necessary to simplify a way of packaging the types of semiconductor laser diodes or alignment to be performed at the time of packaging in order to ensure optical coupling.

FIG. 10 shows an example of a CAN package including the first type of horizontal cavity edge emitting laser diode that has most widely prevailed these days. In this example, the CAN package includes a laser mounting support (SUP) 1007 placed on a CAN stem (STM) 1001, a horizontal cavity edge emitting laser diode (LD) 1003, a photodiode mounting substrate (sub-mount) (SM) 1004 on which the laser diode (LD) 1003 is mounted, and a monitoring light receiving diode (photodiode) (PD) 1002 that receives a laser beam emanating from the back cleaved facet of the laser diode (LD) 1003 and monitors the operating condition of the laser diode (LD) 1003.

The foregoing construction is an example of the simplest construction of a module package having the capability to monitor a laser beam. Reference numeral 1005 denotes a lens, reference numeral 1006 denotes an optical fiber bearing, reference numeral 1008 denotes an optical fiber, and reference numeral 1009 denotes a pin through which a laser signal, a signal transmitted from a light receiving diode, or a ground potential is transferred.

In the construction shown in FIG. 10, the photodiode support 1007 is formed on the stem 1001, and the photodiode mounting substrate (sub-mount) 1004 on which the laser diode 1003 is mounted is placed on the support 1007. However, the construction needs the special member that is the laser mounting support 1007. Therefore, there are limitations in reducing the cost of the entire package and decreasing the height of the entire package. Eventually, high-density packaging is confronted with limitations. In addition, since the laser diode, optical fiber, and lens have to be mutually independently aligned, there are also limitations in reducing a man-day for manufacture. Therefore, it is advantageous to adopt a vertical cavity surface emitting laser diode or horizontal cavity surface emitting laser diode, which does not need the support or the like but can be surface-mounted, for realizing a compact optical module or simplifying packaging.

Examples of the second type of packaged vertical cavity surface emitting laser diode are described in Japanese Patent Application Laid-Open Publication Nos. 2005-85942 and Hei 10-39162. An optical module described in Japanese Patent Application Laid-Open Publication No. 2005-85942 includes at least a horizontal cavity surface emitting laser diode, optical members including a half mirror or a diffraction grating that reflects, refracts, or diffracts at least part of light vertically emitted from the surface emitting laser diode, a package cover for use in locking the optical members, and a light receiving diode horizontally mounted with respect to the surface emitting semiconductor laser diode. In this construction, the laser diode can be readily surface-mounted. However, in order to stabilize an amount of light emitted from the optical module and an amount of light to be received or monitored, it is necessary to highly precisely adjust light emitted from the surface emitting semiconductor laser diode using the optical members and package cover so as to introduce the light to the light receiving diode. Therefore, the positional relationship between the surface emitting laser diode and package cover have to be highly precisely established during assembling. In addition, optical members including a filter and a diffractive grating and a special package having an oblique package cover are necessary. Therefore, a cost or a take time increases due to increases in the number of components and the number of assembling steps alike.

According to Japanese Patent Application Laid-Open Publication No. Hei 10-39162, a core portion of a light receiving surface of an optical fiber is specially processed to project in a convex manner, and a light emitting surface of a laser diode is dented to be mated with the convex part of the core portion. The convex part is fitted into the dent, whereby the optical fiber is readily aligned with the laser diode in a horizontal direction. However, in this construction, although the simplicity in packaging in the horizontal direction improves, since the distance between the light emitting surface and optical fiber is not precisely controlled, the efficiency in optical coupling is degraded. Further, it is necessary to process the optical fiber in a special shape. This leads to an increase in a cost of manufacture. In addition, when a module employs a generally used optical fiber having an end thereof obliquely cut for preventing light from being reflected and returned to a laser diode, it is hard to form the convex and concave parts in the core portion and laser diode mounting substrate respectively.

An example of a CAN package including the third type of horizontal cavity surface emitting laser diode is disclosed in Japanese Patent Application Laid-Open Publication No. 2008-277445. Since an optical module disclosed in Japanese Patent Application Laid-Open Publication No. 2008-277445 adopts the horizontal cavity surface emitting laser diode, the laser diode can be readily surface-mounted. Therefore, compared with the CAN module including the horizontal cavity edge emitting laser diode like the one shown in FIG. 10, the entire package can be made compact and assembling can be readily achieved. However, in this construction, the laser diode, optical fiber, and lens have to be independently aligned. Therefore, the man-day for manufacture and the cost of manufacture still have their limitations.

Along with a trend of pieces of equipment, which encompass pieces of commercial off-the-shelf equipment, toward large-capacity information transmission at tera-bits per second or more, a compact optical module whose components can be highly densely integrated using an inexpensive fabrication means and which exhibits superb readiness in packaging the components and excellent performance is requested.

An object of the present invention is to provide a compact optical module, which permits highly efficient optical coupling and has components thereof highly densely packaged, by upgrading readiness in alignment of an external optical waveguide (optical fiber) with a surface emitting laser diode (including alignment in a vertical direction).

According to an embodiment intended to accomplish the above object, there is provided a surface emitting laser module including a light emitting diode that includes a semiconductor substrate, a light emitting region formed in the semiconductor substrate, a lens integrated into the light emitting region, and a retaining section integrated to surround the light emitting region into which the lens is integrated, and that emits light from the light emitting region in a vertical direction with respect to a principal surface of the semiconductor substrate, an external optical waveguide that is fitted into and retained by the retaining section and guides light transmitted by the lens and emitted from the light emitting element, and a stem to which the light emitting diode and external optical waveguide are fixed.

Further, there is provided a surface emitting laser module including a light emitting diode that includes a semiconductor substrate, a dent formed in the semiconductor substrate, a light emitting region formed inside the dent, a lens integrated into the light emitting region inside the dent, and a retaining section integrated to surround the principal surface of the semiconductor substrate, and that emits light from the light emitting region in a vertical direction with respect to a principal surface of the semiconductor substrate, an external optical waveguide that is fitted into and retained by the retaining section and guides light transmitted by the lens and emitted from the light emitting element, and a stem to which the light emitting diode and external optical waveguide are fixed.

Further, there is provided a vertically illuminated photodiode module including a light emitting diode that includes a semiconductor substrate, a dent formed in the semiconductor substrate, a light receiving region formed inside the dent, a lens integrated into the light receiving region inside the dent, and a retaining section integrated to surround the perimeter of the dent, and that receives light in a vertical direction with respect to the principal surface of the semiconductor substrate, an external optical waveguide that is fitted into and retained by the retaining section and emits light to the light receiving diode through the lens, and a stem to which the light receiving diode and external optical waveguide are fixed.

Owing to the employment of a light emitting diode or light receiving diode having a retaining section, which retains an external optical waveguide (optical fiber), integrated thereinto, the optical fiber and light emitting diode or the like can be readily self-aligned. In addition, the distance between the optical fiber and light emitting diode or the like can be arbitrarily, automatically, and precisely controlled. Therefore, a compact optical module that permits highly efficient optical coupling and has components thereof highly densely packaged can be provided.

DESCRIPTION OF THE PREFERRED EMBODIMENTS

Embodiments of the present invention will be described below.

First Embodiment

The construction of an optical module in accordance with a first embodiment will be described in conjunction with FIG. 1A, FIG. 1B, and FIG. 6. The present embodiment is an example in which a horizontal cavity vertical emission laser diode (third type) is adopted as a light emitting diode.

Figure 1A:
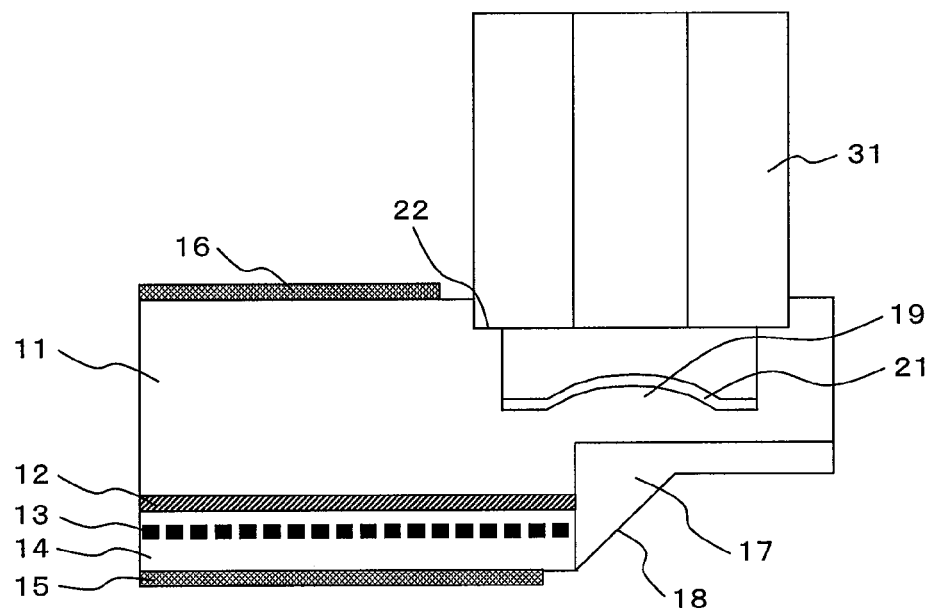
FIG. 1A is a sectional view of a packaged horizontal cavity vertical emission laser diode employed in an optical module in accordance with a first embodiment.
Figure 1B:
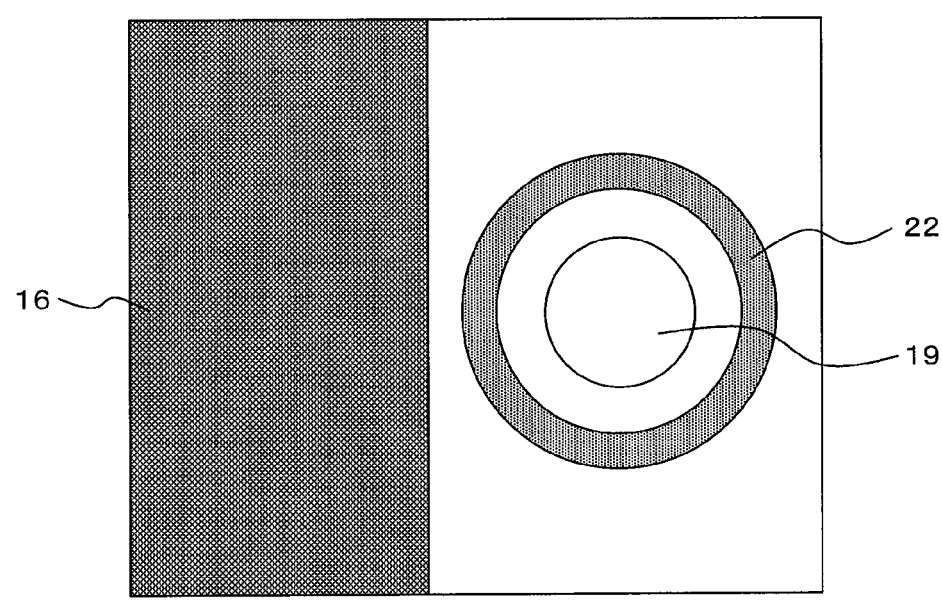
FIG. 1B is a top view of the horizontal cavity vertical emission laser diode employed in the optical module in accordance with the first embodiment.

FIG. 1A is a sectional view of a plane horizontal to a cavity of a laser diode, and FIG. 1B shows a light emitting surface of the laser diode. The horizontal cavity vertical emission laser diode employed in the present embodiment has an active layer 12 layered or grown on an n-type semiconductor substrate 11. A grating layer 13, a p-type cladding layer 14, and a p-type electrode 15 are formed on the active layer 12. Nitrogen-doped indium phosphide (InP) is used to form the n-type semiconductor substrate 11, and a strained quantum well structure made of indium gallium aluminum arsenide (InGaAlAs) is adopted for the active layer 12. Gallium indium arsenide phosphide (GaInAsP) or the like is used to form the grating layer 13. Phosphorus-doped InP is used to form the p-type cladding layer 14. A reflecting mirror 18 is formed by etching a semiconductor buried layer 17. At this time, Fe doped semi-insulating InP or the same semiconductor material as the one made into the p-type cladding layer may be used to form the semiconductor buried layer 17. Reference numeral 16 denotes an n-type electrode.

A retaining section (concave step) 22 that retains an external optical waveguide (optical fiber) 31 is integrated into the n-type semiconductor substrate 11. An integrated lens 19 formed by etching the n-type semiconductor substrate 11 is integrated into the bottom of the retaining section (concave step) 22. An anti reflection coating 21 realized with an aluminum (aluminum oxide) film of, for example, 200 nm thick is applied to the surface of the integrated lens 19.

The concave step 22 has, as shown in FIG. 1B, a circular perimeter, and the diameter of the perimeter is squared with the diameter of the external optical waveguide (optical fiber) 31. The integrated lens 19 and concave step 22 are concentric with each other. In consideration of the positions of the optical axis of the integrated lens and the center axis of the optical fiber 31, the perimetric diameter of the concave step 22 is preferably larger than the diameter of the optical fiber 31, or more particularly, larger by +2 μm or less than the diameter of the optical fiber 31.

The optical fiber 31 is, as shown in FIG. 1A, fitted into the concave step 22. When the laser diode and optical fiber 31 are directly coupled to each other, alignment of the optical fiber in the horizontal direction of the n-type semiconductor substrate 11 is automatically completed. Further, the height of the concave step 22 is adjusted in consideration of a permissible light-receiving angle, at which the integrated lens 19 and optical fiber 31 meet, so that a laser beam emitted through the surface of the lens can fall on the optical fiber 31 without a loss. The distance between the laser beam emitting surface and optical fiber 31 is automatically optimized.

Since a component such as another lens may not be interposed between the laser diode and optical fiber 31, the module can be made compact. In the present embodiment, a silica single-mode optical fiber having a diameter of 125 μm and being compatible with a wavelength of 1.3 μm is adopted as the optical fiber 31. Alternatively, a plastic optical fiber or a flexible optical fiber may be employed.

Figure 6:
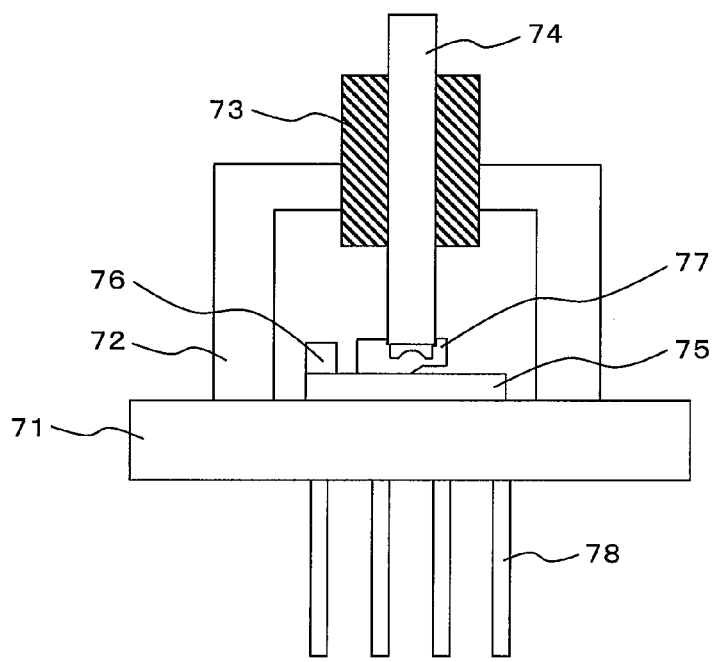
FIG. 6 is a sectional view of the package of the horizontal cavity vertical emission laser module in accordance with the first embodiment.

FIG. 6 shows an example of a package of an optical module employing the horizontal cavity vertical emission laser diode. A photodiode mounting substrate 75 having a laser diode 77 mounted thereon with the junction thereof facing down, and a photodiode 76 are placed on a stem 71. In the present embodiment, the diode 77 is a horizontal cavity vertical emission laser diode. Further, as mentioned above, an optical fiber 74 is fitted into a dent formed in a substrate of the horizontal cavity vertical emission laser diode, and thus borne. An optical fiber support 73 using a ferrule is fixed to the stem by means of a cap 72.

Figure 8:
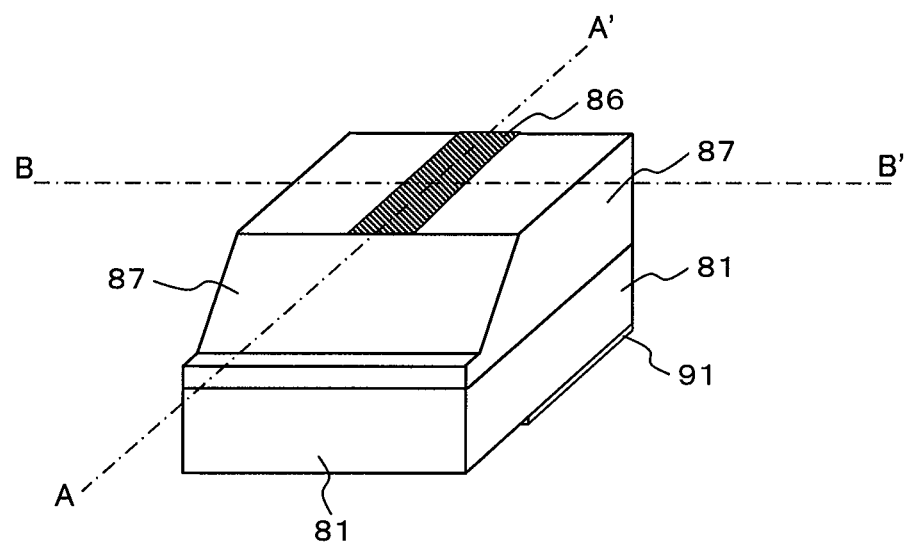
FIG. 8 is an overhead view of the horizontal cavity vertical emission laser diode employed in the optical module in accordance with the first embodiment.
Figure 9:
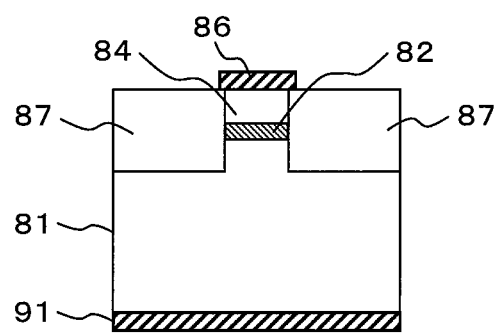
FIG. 9 is a B-B sectional view of the horizontal cavity vertical emission laser diode shown in the overhead view of FIG. 8.
Figure 10:
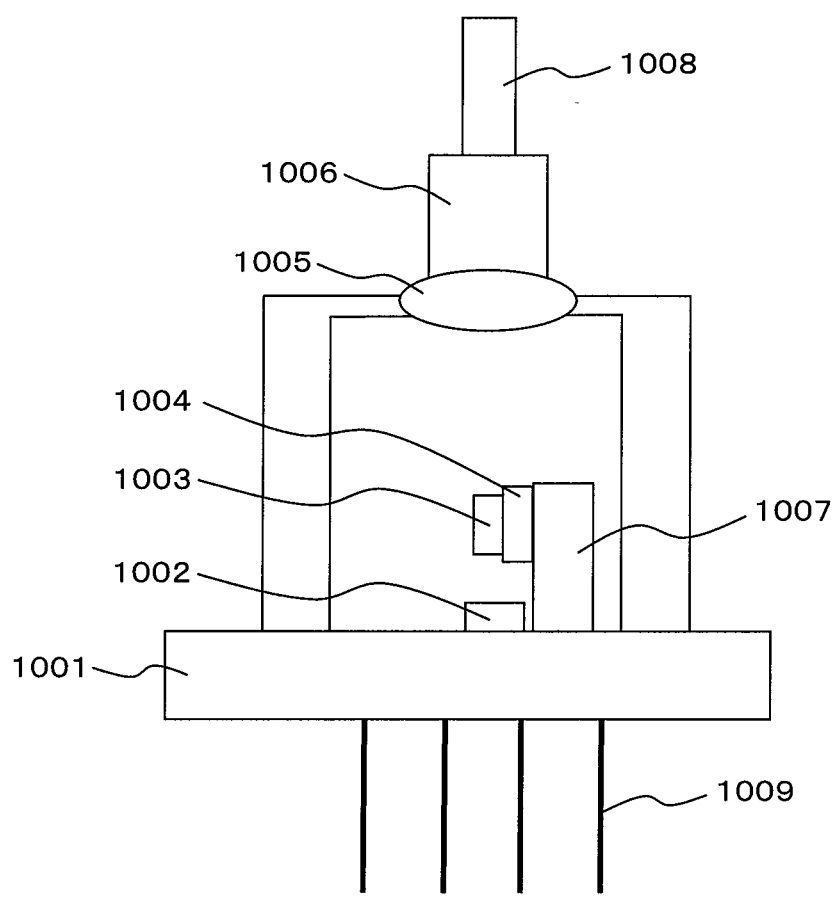
FIG. 10 is a diagram for use in explaining a CAN package including a horizontal cavity edge emitting laser diode in accordance with a related art.

Referring to FIG. 7A to FIG. 7G, a fabrication method for the horizontal cavity vertical emission laser diode in which the present invention is implemented will be detailed below. FIG. 8 is an overhead view of the laser diode. FIG. 7A to FIG. 7G are explanatory diagrams showing an AA' cutting plane shown in FIG. 8 so as to describe steps of fabricating the laser diode. FIG. 9 is a sectional view showing a BB' cutting plane shown in FIG. 8. The indium gallium aluminum arsenide (InGaAlAs) quantum well horizontal cavity surface emitting laser diode for emitting light having a wavelength of 1.3 μm, which is employed in the present embodiment, has a buried heterostructure, that is, has a semiconductor buried layer 87, which is made of a semi-insulating semiconductor, buried in a semiconductor heterostructure processed to be striped.

In this example, the semiconductor buried layer (SI) 87 made of a high-resistance semi-insulating semiconductor having iron (Fe) doped into indium phosphide (InP) is buried to surround the striped optical waveguide portion of the buried heterostructure. The n-type semiconductor contains sulfur (S) as an impurity, and the p-type semiconductor contains zinc (Zn) as the impurity.

Figure 7A:
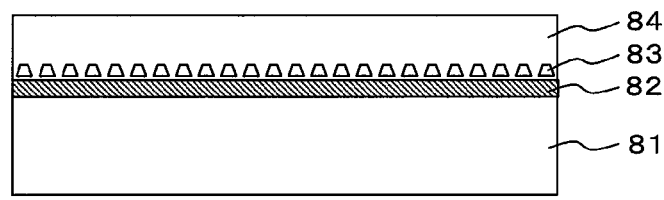
FIG. 7A is a sectional view showing a fabrication step for a horizontal cavity vertical emission laser diode employed in the optical module in accordance with the first embodiment.

FIG. 7A is a sectional view of a laminated structure of a wafer that has not been processed and is employed in the present embodiment. An n-type InP semiconductor substrate is adopted as an n-type semiconductor substrate 81. The diameter of the n-type semiconductor substrate 81 ranges from 2 to 3 inch, and the thickness thereof is on the order of 450 μm. An active layer 82 lies on the n-type semiconductor substrate 81. The active layer 82 is made of undoped indium gallium aluminum arsenide (InGaAlAs) and interposed between an n-type optical confinement layer made of n-type InGaAlAs and a p-type optical confinement layer made of p-type InGaAlAs. The active layer 82 has a strained multiple quantum well structure, that is, has a well layer of 7 nm thick and a barrier layer of 8 nm thick layered five times. The well layer and barrier layer may be layered by any other number of times (for example, three or four times). The strained multiple quantum well structure is designed to satisfactorily realize the properties of a laser.

On the active layer 82, a diffractive grating layer 83 made of an indium gallium arsenide phosphide (InGaAsP)-series material is buries in a second semiconductor layer (p-type cladding layer) 84 that is made of p-type InP and functions as a cladding layer. The active layer 82 and diffractive grating layer 83 are structured so that the oscillatory wavelength of a distributed feedback (DFB) laser at room temperature will be 1310 nm.

The capability of an optical waveguide is produced by sandwiching the active layer 82 with cladding layers exhibiting a lower refractive index, and realized by a laminated structure including the cladding layer, active layer, and cladding layer. According to the embodiment, optical confinement layers are formed with a quantum well layer between them in order to intensify optical confinement in the active layer. Naturally, the refractive index of the cladding layer is lower than the refractive index of the optical confinement layers. In the present embodiment, the semiconductor substrate 81 fills the role of the first semiconductor layer serving as the cladding layer. Needless to say, another cladding layer may be formed on the semiconductor substrate.

The conductivity type of the grating layer 83 is the p type. This kind of structure is called a refractive-index coupling distributed feedback (DFB) laser structure because the refractive index alone cyclically varies in a light propagating direction. In the present embodiment, the diffractive grating layer (DG) 83 is uniformly formed in the entire region in the DFB laser structure. If necessary, a so-called phase shift structure having the phase of a diffraction grating shifted may be formed in part of the region. Although the present embodiment relates to the DFB laser structure, a distributed Bragg reflector (DBR) laser structure will do.

Next, a fabrication process employed in the present embodiment will be described in conjunction with FIG. 7B to FIG. 7G. First, in order to form a laser structure, an optical confinement layer made of n-type InGaAlAs, a strained multiple quantum well layer made of InGaAlAs, and the active layer 82 realized with an optical confinement layer made of p-type InGaAlAs are formed on the n-type semiconductor layer 81 (cladding layer) realized with an n-type InP substrate.

Thereafter, a semiconductor multilayer member including the grating layer 83 made of InGaAsP is formed on the active layer 82. Further, a second semiconductor layer 84 (cladding layer) made of p-type InP is formed on the multilayer member. A carrier concentration derived from doping is the eighteenth power of 10 per cubic centimeter ($10^{18}/cm^3$) irrespective of the n type or p type of the material. The InP wafer having the multilayer structure is coated with a silicon dioxide film serving as a protective mask 186 (FIG. 7B).

Figure 7B:
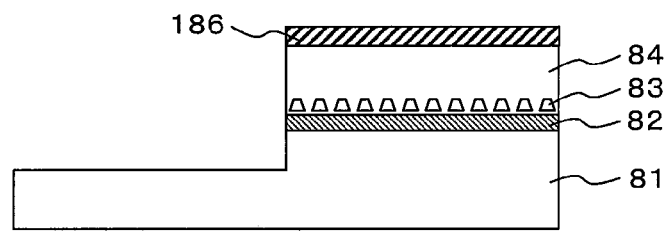
FIG. 7B is a sectional view showing a fabrication step for the horizontal cavity vertical emission laser diode employed in the optical module in accordance with the first embodiment.

The silicon dioxide mask 186 is used to etch the p-type cladding layer 84, grating layer 83, active layer 82, and part of the n-type semiconductor substrate 81, whereby an optical waveguide layer is formed (FIG. 7B). The etching is performed until part of the semiconductor substrate below the active layer 82 is bared. In the present embodiment, the etching is performed by approximately 7 μm. For the etching, one of a dry etching method such as reactive ion etching (RIE) using a chlorine-based gas and a wet etching method using a bromine-based solution or the like, or both thereof may be adopted.

Figure 7C:
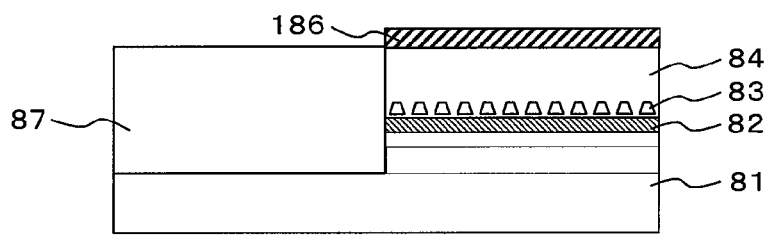
FIG. 7C is a sectional view showing a fabrication step for the horizontal cavity vertical emission laser diode employed in the optical module in accordance with the first embodiment.

Next, the present sample is carried into a crystal growth furnace, and the semiconductor buried layer 87 formed with a semi-insulating semiconductor made of InP that has doped with iron at 600° C. is buried and grown (FIG. 7C). A buried heterostructure is formed by following the etching step and a step of re-growing a buried layer. The buried heterostructure is a structure having a material, which is used to confine light, buried in both the sides of the optical waveguide layer in a light advancing direction (FIG. 9). The material to be used for confinement is normally a high-resistance material. In the present embodiment, a semi-insulating layer made of high-resistance InP doped with iron is employed.

At the step of forming the buried structure, the semiconductor buried layer 87 realized with a semi-insulating semiconductor is, as shown in FIG. 9, buried in the left and right sides of the optical waveguide layer in the light advancing direction. At the same time, the semiconductor buried layer 87 realized with the semi-insulating semiconductor is, as shown in FIG. 7C, buried in the light emitting-side edge of the optical waveguide layer. The reason why InP is buried in the distal part of the optical waveguide layer is that a portion of a 45° tilted mirror to be etched can be made of an InP material (Fe—InP) alone and the mirror can be readily perfectly smoothed through the etching.

Figure 7D:
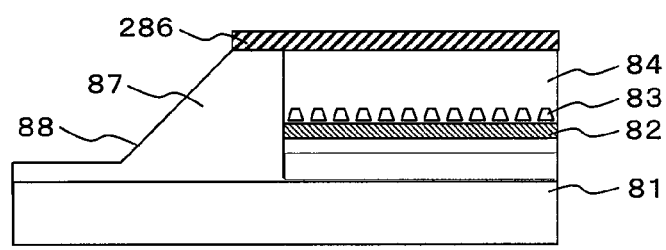
FIG. 7D is a sectional view showing a fabrication step for the horizontal cavity vertical emission laser diode employed in the optical module in accordance with the first embodiment.

Thereafter, the protective mask 186 realized with a silicon dioxide film and used as a selective growth mask for burying and growing is removed in order to form a silicon nitride film 286 serving as an etching mask. The semiconductor buried layer (SI) 87 realized with a semi-insulating semiconductor made of InP doped with iron (Fe) at a tilting angle of 45° is etched (FIG. 7D).

For the oblique etching, a chemically assisted ion beam etching (CAIBE) method using chlorine and argon gases is adopted. A wafer is tilted at an angle of 45° and then etched, whereby 45° etching is achieved. In the present embodiment, the CAIBE method is adopted as the etching method. Alternatively, a reactive ion beam etching (RIBE) method using a chlorine-based gas or a wet etching method will do.

Thereafter, after the silicon nitride film 286 is removed, a second electrode 86 (p-type electrode) is deposited on the second semiconductor layer (p-type cladding layer) 84. Further, after the back surface of the substrate is ground by a thickness of 130 μm, a silicon nitride mask 291 is formed on the back surface of the substrate.

Figure 7E:
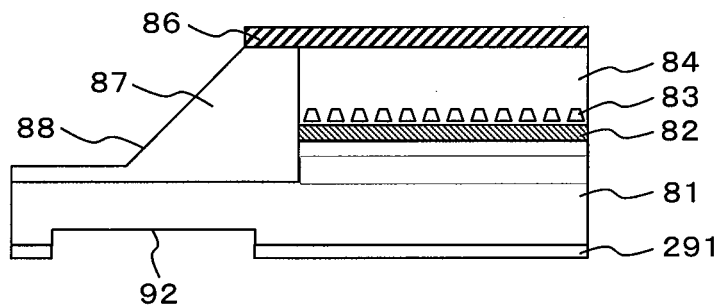
FIG. 7E is a sectional view showing a fabrication step for the horizontal cavity vertical emission laser diode employed in the optical module in accordance with the first embodiment.

Thereafter, reactive ion etching is performed using a mixed gas of methane and hydrogen, whereby the substrate is circularly etched by a diameter of 125 μm and a depth of 20 μm in order to form a retaining section (concave step) 92. At this time, the silicon nitride mask 291 is formed so that the center position of the circle comes immediately below a point at which an extension of the active layer 82 meets a 45° tilted reflecting mirror 88 (FIG. 7E). The circle may be changed to an ellipse according to a usage.

Figure 7F:
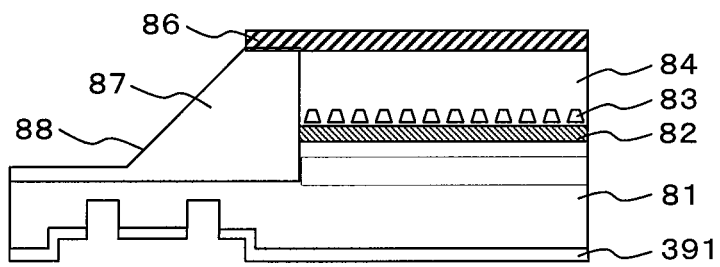
FIG. 7F is a sectional view showing a fabrication step for the horizontal cavity vertical emission laser diode employed in the optical module in accordance with the first embodiment.

Thereafter, the silicon nitride mask 291 is removed in order to re-form a silicon nitride film 391. Reactive ion etching is performed using the mixed gas of methane and hydrogen in order to etch the inside of the circular retaining section (concave step) 92 having the diameter of 125 μm. Thus, the perimeter of a lens portion is formed in the shape of a doughnut having a diameter of approximately 80 μm and a depth of approximately 30 μm (FIG. 7F).

Figure 7G:
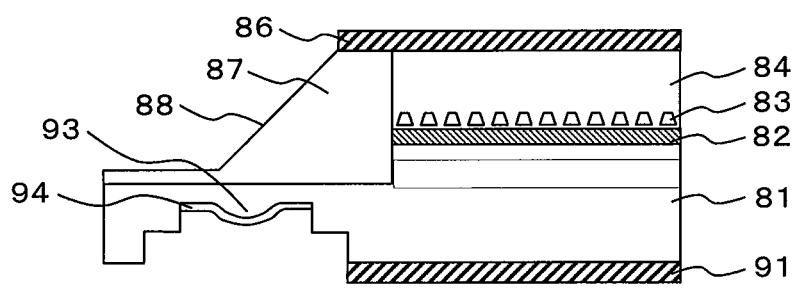
FIG. 7G is a sectional view showing a fabrication step for the horizontal cavity vertical emission laser diode employed in the optical module in accordance with the first embodiment.

Subsequently, the silicon nitride film 391 is removed from the top of a columnar part surrounded with the doughnut-shaped groove, and wet etching is carried out. Eventually, the surface of the columnar part is etched and rounded, and a back-surface InP lens 93 is formed (FIG. 7G). Since the convex lens 93 is formed on the beam emitting surface, a beam exhibiting a narrow radiating angle and including highly parallel rays can be produced. Reference numeral 91 denotes an n-type electrode, and reference numeral 94 denotes an anti reflection coating.

The horizontal cavity surface emitting laser diode employed in the present embodiment offers a beam spread angle of 2°, while the beam spread angle offered by a typical edge emitting laser diode for communications is 30°. Therefore, the horizontal cavity surface emitting laser diode can produce a beam quite narrowly emitted at the angle that is an approximately one-fifteenth. Since the lens portion has a diameter of approximately 100 µm, the spread angle of a laser beam to be emitted is on the order of 10°. Thus, by varying the diameter of the lens portion, the curvature of a lens can be controlled, that is, the focal length of the lens can be controlled.

An optical module employing the horizontal cavity surface emitting laser diode fabricated through the aforesaid process is produced. FIG. 6 is a schematic diagram of the construction of the produced optical module. To begin with, the horizontal cavity surface emitting laser diode 77 is mounted on the photodiode mounting substrate 75 with the junction thereof facing downward. In the present embodiment, the photodiode mounting substrate 75 is a laser sub-mount having an aluminum nitride (AlN) substrate of 200 µm thick patterned with a gold-tin (AgSn) solder.

Thereafter, the photodiode mounting substrate (laser sub-mount) 75 on which the horizontal cavity surface emitting laser diode (LD) 77 is mounted is locked on the stem (STM) 71 using a silver epoxy. Thereafter, the silica single-mode optical fiber 74 accompanied by the optical fiber support 73 and compatible with a wavelength of 1.3 µm is fitted into the optical fiber retaining section (step) formed in the horizontal cavity surface emitting laser diode 77, whereby self-alignment is achieved. The optical fiber 74 is fitted into the optical fiber retaining section using a core adjuster.

Thereafter, the cap 72 is placed on the stem 71, and is then fixed to the optical fiber support 73. The contact parts of the stem 71 and cap 72 are bonded in order to thus produce an optical module. Accordingly, the deviation of the ray axis of a laser beam from the optical axis of the lens or the center of the optical fiber from each other can be limited to ±1.5 µm or less. The compact optical module permitting highly efficient optical coupling can be obtained. Reference numeral 78 denotes a pin through which a signal transmitted from the laser diode, a signal transmitted from a light receiving diode, or a ground potential is transferred.

As mentioned above, the optical fiber 74 is fitted into the retaining section (concave step) 92 formed in the laser diode 77. Therefore, alignments in horizontal and vertical directions can be readily achieved, and a cost of production can be largely reduced. In addition, since an external lens is unnecessary, the number of components can be decreased. A compact low-cost optical module can be produced.

The present embodiment is an example in which the present invention is applied to an InGaAlAs quantum well laser diode formed on an InP substrate to emit light having a wavelength of 1.3 µm. The material made into the substrate or active layer and the oscillatory wavelength are not limited to those mentioned above. The present invention can be applied to a laser diode made of any other material, for example, an InGaAsP laser diode capable of emitting light having a wavelength of 1.55 µm.

According to the present embodiment, readiness in alignment of an optical fiber with a surface emitting laser diode (including alignment in a vertical direction) is upgraded. Thus, a compact optical module permitting highly efficient optical coupling and having components thereof highly densely packaged can be provided.

Second Embodiment

Figure 2A:
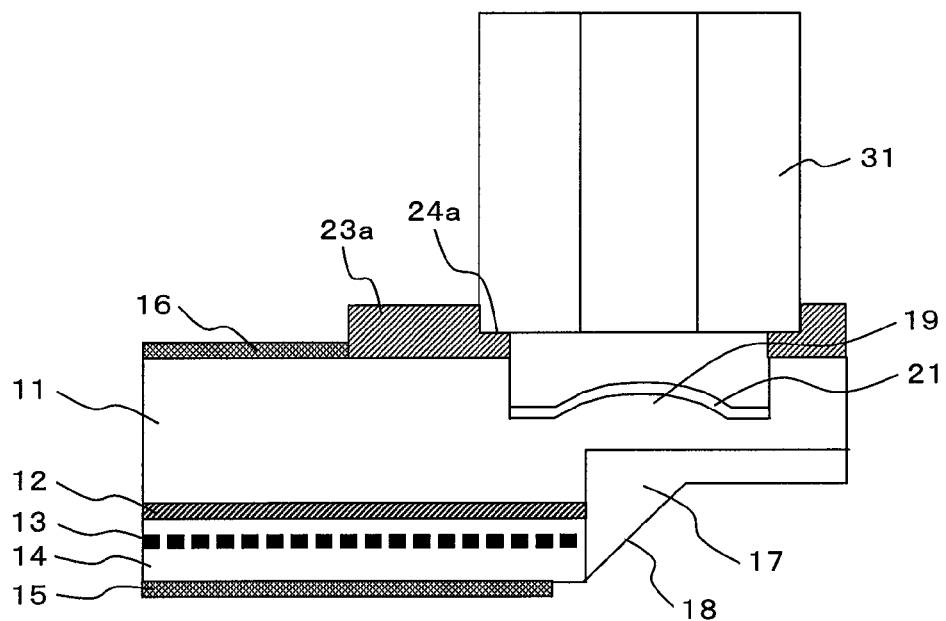
FIG. 2A is a sectional view of a packaged horizontal cavity vertical emission laser diode employed in an optical module in accordance with a second embodiment.
Figure 2B:
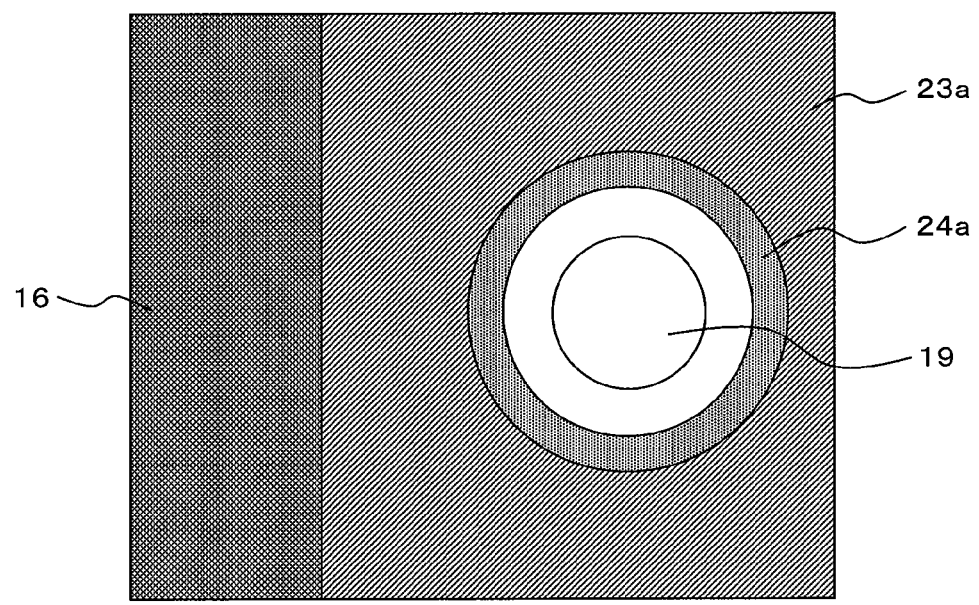
FIG. 2B is a top view of the horizontal cavity vertical emission laser diode employed in the optical module in accordance with the second embodiment.

Referring to FIG. 2A and FIG. 2B, a second embodiment employing another horizontal cavity vertical emission laser diode will be described below. The components that have been described in relation to the first embodiment but will not be described in relation to the present embodiment are identical to those of the first embodiment.

FIG. 2A is a sectional view of a plane of a laser diode, which is employed in an optical module in accordance with the present embodiment, horizontal to a cavity. FIG. 2B shows a light emitting surface of the laser diode. In the present embodiment, a dent is formed in an n-type semiconductor substrate 11, and an integrated lens 19 is, similarly to the one of the first embodiment, formed on the bottom of the dent by etching the n-type semiconductor substrate 11. The lens 19 may be formed using any other material integrated into the substrate 11. Any other material may be processed to form the lens 19, and the lens 19 may then be integrated into the substrate 11. The employment of a material other than the material made into the substrate leads to an expansion of freedom in producing the lens. When any other material is employed, the dent may not necessarily be formed.

A concave step formation integrated member 23a including an optical fiber retaining section (step) 24a is integrated to surround the perimeter of the dent. If the dent is not formed, the concave step formation integrated member including the retaining section is integrated to surround a light emitting region. At this time, the concave step formation integrated member 23a is integrated by, for example, processing a silicon substrate or the like to form a vertical hole pattern having the optical fiber retaining section (step) 24a, and joining a laser production wafer (semiconductor substrate 11) and the silicon substrate at the level of the wafer.

Since the vertical hole pattern is formed with the same precision as the precision with which the wafer is fabricated, the hole formed in the silicon substrate and the lens 19 integrated into the laser diode can be highly precisely aligned with each other so that they are, as shown in FIG. 2B, concentric to each other. In addition, mass-productivity is excellent. After the semiconductor substrate 11 and silicon substrate are joined at the level of the wafer, the silicon substrate may be processed in order to form the vertical hole pattern including the optical fiber retaining section (step) 24a. In this specification, when it says that, for example, a lens or a retaining section is integrated, it means that the retaining section is formed in a light emitting diode or light receiving diode to be employed in an optical module. The lens or retaining section may be formed by processing a substrate or by processing a film layered on the substrate. Further, another material may be processed and then joined with a wafer at the level of the wafer. The material may be joined with the wafer and then processed.

As mentioned above, since an optical fiber 31 is fitted into the formed optical fiber retaining section (concave step) 24a, the optical fiber can be automatically aligned with a light emitting point on a plane horizontal to the n-type semiconductor substrate 11. At this time, the distance between the light receiving surface of the optical fiber and the lens is automatically optimally controlled as the sum of the depth of the dent and the thickness of the concave step formation integrated member 23a. In the present embodiment, a silica single-mode optical fiber having a diameter of 125 µm and being compatible with a wavelength of 1.3 µm is adopted as the optical fiber 31. Needless to say, a plastic optical fiber or a flexible optical fiber will do.

According to the present embodiment, the same advantage as the one of the first embodiment can be provided. In addition, since the optical fiber retaining section can be formed using a material such as a silicon substrate other than the material made into the semiconductor substrate 11, the optical fiber retaining section having more precise dimensions can be formed. Eventually, an optical module permitting highly efficient optical coupling can be provided.

Third Embodiment

Figure 3:
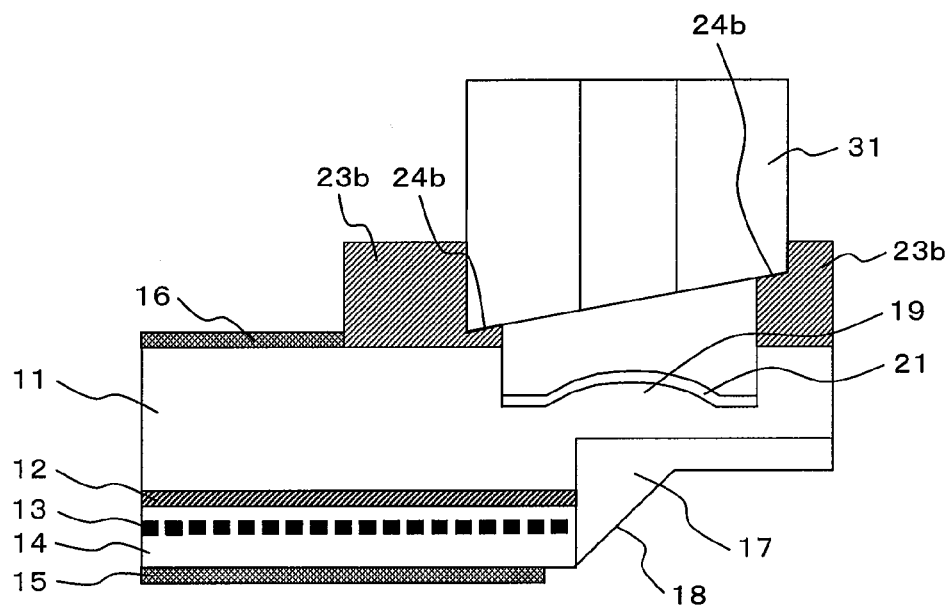
FIG. 3 is a sectional view of a packaged horizontal cavity vertical emission laser diode employed in an optical module in accordance with a third embodiment.

Referring to FIG. 3, a third embodiment employing another horizontal cavity vertical emission laser diode will be described below. The components that have been described in relation to the first or second embodiment but will not be described in relation to the present embodiment are identical to those of the first or second embodiment.

FIG. 3 is a sectional view of a plane of a laser diode, which is employed in an optical module in accordance with the present embodiment, horizontal to a cavity. Similarly to the second embodiment, a concave step formation integrated member 23b is integrated into the n-type semiconductor substrate 11. Unlike the second embodiment, a dent in an optical fiber retaining section (concave step) 24b is, as shown in FIG. 3, formed to have a slope. The slope is designed to square with an angle of the slope of an anti-reflection obliquely cut optical fiber. The dent is tilted at approximately 8° with respect to a horizontal plane. Therefore, when the obliquely cut optical fiber is, as shown in FIG. 3, fitted into the optical fiber retaining section (concave step) 24b, the horizontal position and the distance between the optical fiber and integrated lens can be optimized through alignment. Incidentally, the retaining section may be formed in the semiconductor substrate, and the substrate may be processed so that the dent has the slope.

According to the present embodiment, the same advantage as the one of the first embodiment can be provided. In addition, since an anti-reflection obliquely cut optical fiber is included, an optical module permitting more highly efficient optical coupling can be provided.

Fourth Embodiment

Figure 4:
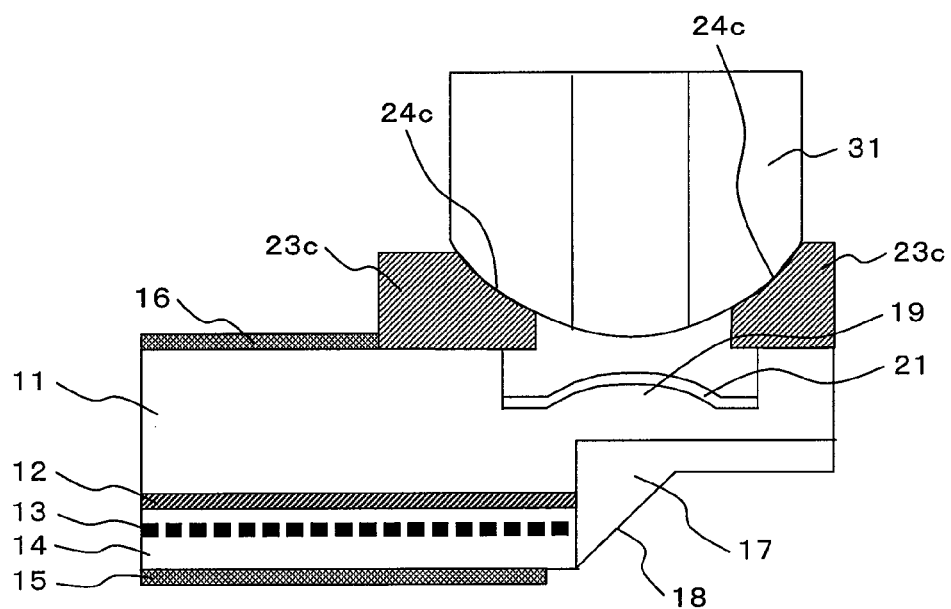
FIG. 4 is a sectional view of a packaged horizontal cavity vertical emission laser diode employed in an optical module in accordance with a fourth embodiment.

Referring to FIG. 4, a fourth embodiment employing another horizontal cavity vertical emission laser diode will be described below. The components that have been described in relation to any of the first to third embodiments but will not be described in relation to the present embodiment are identical to those of any of the first to third embodiments.

FIG. 4 is a sectional view of a plane of a laser diode, which is employed in an optical module in accordance with the present embodiment, horizontal to a cavity. A concave step formation integrated member 23c is, similarly to the one included in the second or third embodiment, integrated into the n-type semiconductor substrate 11. Unlike the second and third embodiments, a dent in an optical fiber retaining section (concave step) 24c is, as shown in FIG. 4, formed to be obliquely tapered. The taper is designed to have the curvature thereof squared with the curvature of a spherical-tip fiber whose distal part is shaped like a lens. Therefore, when the spherical-tip fiber is, as shown in FIG. 4, fitted into the optical fiber retaining section (concave step) 24c, the horizontal position of the fiber and the distance between the fiber and integrated lens can be optimized through alignment. The retaining section may be formed in the semiconductor substrate, and the substrate may be processed so that the dent has a slope. The obliquely tapered shape of the optical fiber retaining section is attained by, for example, concentrically dry-etching the concave step formation integrated member 23c so that the center part of the concave step formation integrated member 23c is deeper, and then rounding the resultant concave step formation integrated member 23c through wet-etching.

According to the present embodiment, the same advantage as the one of the first embodiment can be provided. Further, the curvatures of the distal part of an optical fiber and the optical fiber retaining section are squared with each other. Eventually, an optical module permitting more highly efficient optical coupling can be provided.

Fifth Embodiment

Figure 5:
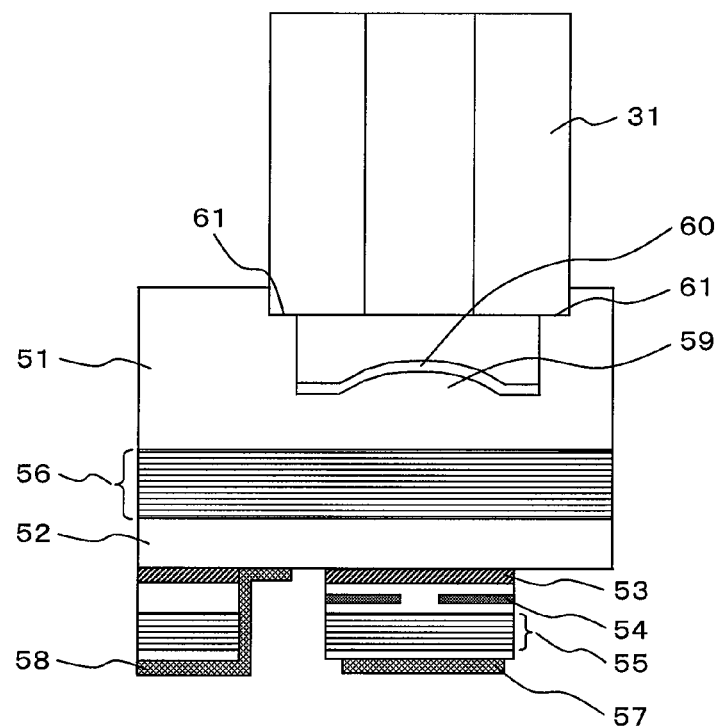
FIG. 5 is a sectional view of a packaged vertical cavity vertical emission laser diode employed in an optical module in accordance with a fifth embodiment.

Referring to FIG. 5, a fifth embodiment employing a back-surface emission vertical cavity vertical emission laser diode will be described below. The components that have been described in relation to the first embodiment but will not be described in relation to the present embodiment are identical to those of the first embodiment.

A vertical cavity vertical emission laser diode to be employed in an optical module in accordance with the present embodiment has an n-type semiconductor distributed Bragg reflector (DBR) 56 formed on a semi-insulating semiconductor substrate 51. An n-type cladding layer 52, an active layer 53, and a p-type semiconductor DBR 55 are subsequently formed. A current constriction layer 54 for constricting an injected current is interposed between the active layer 53 and p-type semiconductor DBR 55. Reference numeral 57 denotes a p-type electrode, and reference numeral 58 denotes an n-type electrode.

An optical fiber retaining section (concave step) 61 is formed in the semi-insulating semiconductor substrate 51. Further, an integrated lens 59 formed by etching the semi-insulating semiconductor substrate 51 is integrated into the bottom of the step. An anti reflection coating 60 realized with, for example, an aluminum thin film is applied to the surface of the lens 59. At this time, the lens 59 and optical fiber retaining section (concave step) 61 are concentrically formed, and the height of the step is controlled so that light emitted from the lens 59 can fall on the optical fiber without a loss. Therefore, when an optical fiber retaining section is integrated into a laser diode, automatic alignment can be achieved highly precisely even in the vertical cavity vertical emission laser diode.

A typical vertical cavity vertical emission laser diode having an n-type electrode formed in a substrate is structured in such a manner that a p-type electrode is formed to surround a light emitting surface. Therefore, there is difficulty in integrating a lens into the light emitting surface. Even when the lens can be integrated into the light emitting surface, marked restrictions are imposed on a design. The present invention is not therefore implemented in the typical vertical cavity vertical emission laser diode. However, as shown in FIG. 5, high-precision automatic alignment relating to the present invention can be achieved in the back-surface emission vertical cavity vertical emission laser diode having such an electrode structure that the p-type and n-type electrodes are led out to a surface opposite to the substrate.

According to the present embodiment, since readiness in alignment of an optical fiber with a surface emitting laser diode (including alignment in a vertical direction) is upgraded, a compact optical module permitting highly efficient optical coupling and having components thereof highly densely packaged can be provided.

Sixth Embodiment

Figure 11:
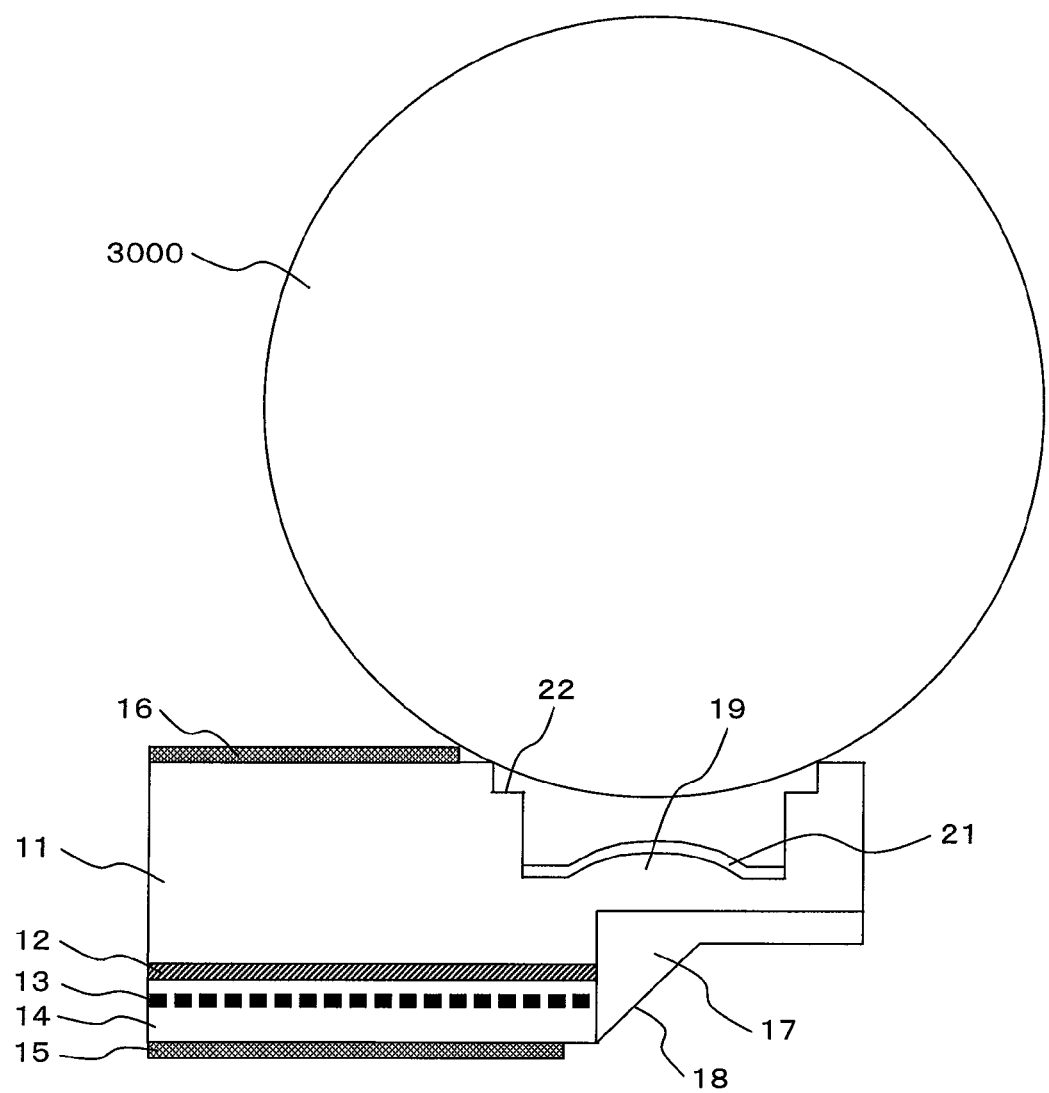
FIG. 11 is a sectional view of a packaged horizontal cavity vertical emission laser diode employed in an optical module in accordance with the sixth embodiment.

Referring to FIG. 11, a sixth embodiment will be described below. The present embodiment is an example of an optical module having a ball lens self-aligned with a light emitting portion of a horizontal cavity surface emitting laser diode. The construction of an optical fiber retaining section and a fabrication method thereof described in relation to any of the first, second, and fourth embodiments can be applied to the present embodiment.

FIG. 11 is a schematic diagram showing a ball lens mounted in the retaining section 22 of the horizontal cavity vertical emission laser diode shown in FIG. 1A. In the present embodiment, a ball lens 3000 is a spherical silica ball lens having a diameter of 400 μm. In some cases, a ball lens whose diameter ranges from about 500 μm to about 1000 μm or a ball lens made of a high refractive-index glass material may be adopted. The perimeter of the retaining section 22 or the height thereof may be modified according to the size of the ball lens or any other condition thereof. In the present embodiment, a reinforcement member may be inserted to a space below the semiconductor buried layer 17 that is etched to be thin. This leads to a reduction in a deviation of an optical system.

Next, a procedure of mounting the ball lens 3000 on the horizontal cavity surface emitting laser diode will be described below. First, a resin-based adhesive is applied to the retaining section (step) 22 integrated into the horizontal cavity surface emitting laser diode. Thereafter, the ball lens is fitted into the retaining section (step) 22, whereby the integrated lens 19 integrated into the n-type semiconductor substrate 11 and the ball lens are readily self-aligned with each other. Thus, when a retaining section is integrated into a light emitting diode, a lens integrated into the diode and an external lens can be readily and precisely assembled by mounting the external lens in the integrated lens. Therefore, the freedom in constructing an optical module or the freedom in designing it can be largely expanded.

According to the present embodiment, since readiness in alignment of a ball lens with a surface emitting laser diode (including alignment in a vertical direction) is upgraded, a compact optical module permitting highly efficient optical coupling and having components thereof highly densely packaged can be provided.

Seventh Embodiment

An optical module in accordance with a seventh embodiment will be described in conjunction with FIG. 12. The present embodiment is an example in which a surface incident photodiode is adopted as a light receiving diode. The optical fiber and the construction and fabrication method of an optical fiber retaining section, which are described in relation to any of the first to fourth embodiments, can be applied to the present embodiment.

Figure 12:
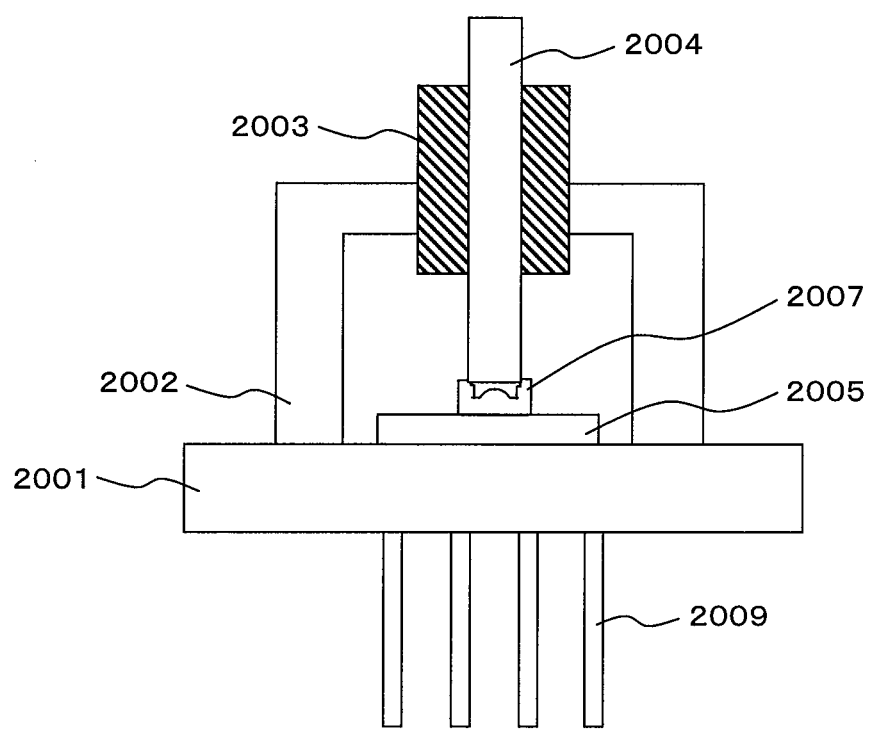
FIG. 12 is a sectional view of a packaged surface-incident photodiode module in accordance with the seventh embodiment.

FIG. 12 is a schematic diagram of a surface incident photodiode module in accordance with the present embodiment. A photodiode mounting substrate 2005 having a photodiode 2007 mounted thereon is placed on a stem 2001. The photodiode 2007 is a back-surface incident photodiode having a gallium indium arsenide (GaInAs) optical absorption layer included in an InP substrate. An optical fiber retaining section (stepped structure) into which an optical fiber is fitted is integrated into the back surface of the InP substrate that is a light receiving surface. Formation of the stepped structure in the back-surface incident photodiode is identical to formation of the stepped structure in a laser diode substrate.

Thereafter, a silica-based single-mode optical fiber compatible with a wavelength of 1.3 μm is fitted into the stepped structure of the photodiode 2007, whereby the positions of the optical fiber 2004 and photodiode on a horizontal plane of the light receiving surface, and the distance between the optical fiber and photodiode are adjusted through alignment. For fitting the optical fiber 2004 into the optical fiber retaining section, a core adjuster is employed. Thereafter, an optical fiber support 2003 and a cap 2002 are fixed to the stem 2001 for fear that the optical fiber 2004 and photodiode 2007 may be displaced. At the same time, the optical fiber is secured. Reference numeral 2009 denotes a pin through which a signal transmitted from a light receiving diode or a ground potential is transferred. In the low-cost vertically illuminated photodiode module produced without an optically dynamic alignment step, a light receiving sensitivity of 0.7 W/A is attained.

According to the present embodiment, since readiness in alignment of an optical fiber with a light receiving diode (including alignment in a vertical direction) is upgraded, a compact optical module permitting highly efficient optical coupling and having components thereof highly densely packaged can be provided.

What is claimed is:

1. A surface emitting laser module comprising:
   a light emitting diode that includes a semiconductor substrate, a light emitting region disposed on the semiconductor substrate, a lens integrated into the light emitting region, and a retaining section integrated into the semiconductor substrate to surround the light emitting region into which the lens is integrated, and that emits light from the light emitting region in a vertical direction with respect to a principal surface of the semiconductor substrate;
   an external optical waveguide that is fitted into and retained by the retaining section and guides light transmitted by the lens and emitted from the light emitting diode; and
   a stem to which the light emitting diode and external optical waveguide are fixed,
   wherein the light emitted from the light emitting region proceeds in a vertical direction towards the external optical waveguide with respect to the principal surface of the semiconductor substrate,
   wherein the retaining section has a concave step shape in cross section disposed above the lens,
   wherein the external optical waveguide is a reflected-light prevention optical fiber whose light receiving surface has a predetermined angle with respect to the semiconductor substrate, and
   the retaining section has an angle thereof conformed to the predetermined angle so that the reflected-light prevention optical fiber can be fitted into the retaining section.

2. The surface emitting laser module according to claim 1, wherein the light emitting diode is a horizontal cavity vertical emission laser diode including:
   an active layer that is disposed on the semiconductor substrate and generates light;
   a waveguide layer that is disposed on the semiconductor substrate and guides the light generated from the active layer;
   a cavity structure that is disposed at least in part of the semiconductor substrate and reflects or resonates the light in an in-plane direction of the principal surface of the semiconductor substrate; and
   a reflecting mirror that is disposed in part of the waveguide layer in order to emit a laser beam, which is radiated from the cavity structure, through a back surface of the semiconductor substrate in the vertical direction with respect to the principal surface of the semiconductor substrate.

3. A surface emitting laser module comprising:

a light emitting diode that includes a semiconductor substrate, a dent disposed on the semiconductor substrate, a light emitting region disposed inside the dent, a lens integrated into the light emitting region inside the dent, and a retaining section integrated into the semiconductor substrate to surround the perimeter of the dent, and that emits light from the light emitting region in a vertical direction with respect to a principal surface of the semiconductor substrate;

an external optical waveguide that is fitted into and retained by the retaining section and guides light transmitted by the lens and emitted from the light emitting diode; and a stem to which the light emitting diode and external optical waveguide are fixed, wherein the light emitted from the light emitting region proceeds in a vertical direction towards the external optical waveguide with respect to the principal surface of the semiconductor substrate, wherein the retaining section has a concave step shape in cross section disposed above the lens, wherein the external optical waveguide is a reflected-light prevention optical fiber whose light receiving surface has a predetermined angle with respect to the semiconductor substrate, and the retaining section has an angle thereof conformed to the predetermined angle so that the reflected-light prevention optical fiber can be fitted into the retaining section.

4. The surface emitting laser module according to claim 3, wherein the light emitting diode is a horizontal cavity vertical emission laser diode or a vertical cavity vertical emission laser diode.

5. The surface emitting laser module according to claim 3, wherein the retaining section is formed by processing the semiconductor substrate.

6. The surface emitting laser module according to claim 3, wherein the lens is formed by processing the semiconductor substrate in a curved-surface shape.

* * * * *

UNITED STATES PATENT AND TRADEMARK OFFICE
CERTIFICATE OF CORRECTION

| | | |
|---|---|---|
| PATENT NO. | : 8,755,423 B2 | Page 1 of 1 |
| APPLICATION NO. | : 12/759024 | |
| DATED | : June 17, 2014 | |
| INVENTOR(S) | : Adachi et al. | |

It is certified that error appears in the above-identified patent and that said Letters Patent is hereby corrected as shown below:

<u>ON THE TITLE PAGE</u>

Item "(75) Inventors:" should read as follows:

(75)  Koichiro Adachi, Musashino (JP);
 Yasunobu Matsuoka, Hachioji (JP);
Toshiki Sugawara, Kokubunji (JP);
Masahiro Aoki, Kokubunji (JP)

Signed and Sealed this
Third Day of March, 2015

Michelle K. Lee
*Deputy Director of the United States Patent and Trademark Office*